United States Patent
Callaghan et al.

(10) Patent No.: US 11,650,898 B2
(45) Date of Patent: *May 16, 2023

(54) ON-DIE LOGIC ANALYZER

(71) Applicant: Micron Technology, Inc., Boise, ID (US)

(72) Inventors: Jackson N. Callaghan, Milpitas, CA (US); Kazuaki Ohara, San Jose, CA (US); Ji-Hye G. Shin, Palo Alto, CA (US); Vyjayanthi Prasad, San Jose, CA (US); Rosa M. Avila-Hernandez, Boise, ID (US); Gitanjali T. Ghosh, Boise, ID (US); Rachael R. Skreen, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/729,841

(22) Filed: Apr. 26, 2022

(65) Prior Publication Data

US 2022/0253365 A1 Aug. 11, 2022

Related U.S. Application Data

(63) Continuation of application No. 17/067,288, filed on Oct. 9, 2020, now Pat. No. 11,327,867.

(51) Int. Cl.
*G06F 11/30* (2006.01)
*G01R 31/3177* (2006.01)
(Continued)

(52) U.S. Cl.
CPC ...... *G06F 11/3096* (2013.01); *G01R 31/3177* (2013.01); *G06F 1/06* (2013.01);
(Continued)

(58) Field of Classification Search
CPC .... G06F 11/3096; G06F 1/06; G06F 11/3034; G06F 11/3089; G06F 13/1668;
(Continued)

(56) References Cited

U.S. PATENT DOCUMENTS 7,895,430 B2   2/2011   Luk et al.
8,458,539 B2   6/2013   Kurts et al.
(Continued)

OTHER PUBLICATIONS

G. Knittel, S. Mayer and C. Rothlaender, "Integrating Logic Analyzer Functionality into VHDL Designs," 2008 International Conference on Reconfigurable Computing and FPGAs, Cancun, Mexico, 2008, pp. 127-132. (Year: 2008).*

Baprawski, John, "SerDes System CTLE Basics", Mar. 22, 2012, (10 pgs.), Personal website of John Baprawski, retrieved from https://johnbaprawski.com/wp-content/uploads/2012/04/SerDes_System_CTLE_Basics.pdf.

(Continued)

*Primary Examiner* — Cynthia Britt

(74) *Attorney, Agent, or Firm* — Brooks, Cameron & Huebsch, PLLC

(57) ABSTRACT

An on-die logic analyzer (ODLA) can reduce the time and resources that would otherwise be spent in validating or debugging memory system timings. The ODLA can receive an enable signal with respect to a start command and start a count of clock cycles in response to a first issued command matching the start command defined in a first mode register. The ODLA can stop the count of clock cycles in response to a second issued command matching a stop command defined in a second mode register. The ODLA can write a value indicative of the stopped count to a third mode register or an on-die storage array in response to the stopped count exceeding a previously stored count.

20 Claims, 7 Drawing Sheets

(51) Int. Cl.
  *G06F 1/06* (2006.01)
  *G06F 13/16* (2006.01)
(52) U.S. Cl.
  CPC ...... *G06F 11/3034* (2013.01); *G06F 11/3089* (2013.01); *G06F 13/1668* (2013.01); *G06F 13/1689* (2013.01)
(58) Field of Classification Search
  CPC ............ G06F 13/1689; G06F 2201/88; G01R 31/3177; G11C 29/023; G11C 29/08; G11C 29/1201; G11C 29/12015; G11C 29/20
  See application file for complete search history.

(56) References Cited

U.S. PATENT DOCUMENTS

| | | |
|---|---|---|
| 8,745,455 B2 | 6/2014 | Ramirez et al. |
| 2003/0097615 A1 | 5/2003 | Corti et al. |
| 2007/0192079 A1 | 8/2007 | Rompaey et al. |
| 2011/0041017 A1 | 2/2011 | Zhong et al. |
| 2014/0181605 A1 | 6/2014 | Lingannagari et al. |

OTHER PUBLICATIONS

Allan, Graham, "DDR4 Bank Groups in Embedded Applications", Dec. 22, 2016 (12 pgs.), Synopsys DesignWare Technical Bulletin, retrieved from https://www.synopsys.com/designware-ip/technical-bulletin/ddr4-bank-groups.html.

Koyle et al., "Micron DDR5: Key Module Features", Micron Technical Brief, (7 pgs.), retrieved Jul. 15, 2020 from https://media-www.micron.com/-/media/client/global/documents/products/technical-marketing-brief/ddr5_key_module_features_tech_brief.pdf?la=en&rev=f3ca96bed7d9427ba72b4c192dfacb56.

C. Lu, Z. Chen, L. Wang and X. Zhou, "An Innovative Embedded Logic Analyzer Based Soc Verification Platform," 2006 8th International Conference on Solid-State and Integrated Circuit Technology Proceedings, Shanghai, China, 2006, pp. 1876-1879. (Year: 2006).

M. H. Neishaburi and Z. Zilic, "Hierarchical Embedded Logic Analyzer for Accurate Root-Cause Analysis," 2011 IEEE International Symposium on Defect and Fault Tolerance in VLSI and Nanotechnology Systems, Vancouver, BC, Canada, 2011, pp. 120-128. (Year: 2011).

\* cited by examiner

434

| MR | OP[7] | OP[6] | OP[5] | OP[4] |
|---|---|---|---|---|
| 209 | colspan=4 | DQU2 DFE Tap-1 Bias | | |
| 210 | colspan=4 | DQU2 DFE Tap-2 Bias | | |
| 211 | colspan=4 | DQU2 DFE Tap-3 Bias | | |
| 212 | colspan=4 | DQU2 DFE Tap-4 Bias | | |
| 213 | DQU2 IBCLK Sign | RFU | DQU2 DCA for IBCLK | |
| 214 | DQU2 $V_{REFDQ}$ Sign | DQU2 $V_{REFDQ}$ Offset | | |
| 215 | RFU | | | |
| 216 | RFU | | | |
| 217 | DQU3 DFE Tap-1 Bias | | | |
| 218 | DQU3 DFE Tap-2 Bias | | | |
| 219 | DQU3 DFE Tap-3 Bias | | | |
| 220 | DQU3 DFE Tap-4 Bias | | | |
| 221 | DQU3 IBCLK Sign | RFU | DQU3 DCA for IBCLK | |
| 222 | DQU3 $V_{REFDQ}$ Sign | DQU3 $V_{REFDQ}$ Offset | | |
| 223 | RFU | | | |
| 224 | RFU | | | |
| 225 | DQU4 DFE Tap-1 Bias | | | |
| 226 | DQU4 DFE Tap-2 Bias | | | |
| 227 | DQU4 DFE Tap-3 Bias | | | |
| 228 | DQU4 DFE Tap-4 Bias | | | |
| 229 | DQU4 IBCLK Sign | RFU | DQU4 DCA for IBCLK | |
| 230 | DQU4 $V_{REFDQ}$ Sign | DQU4 $V_{REFDQ}$ Offset | | |
| 231 | RFU | | | |
| 232 | RFU | | | |
| 233 | DQU5 DFE Tap-1 Bias | | | |
| 234 | DQU5 DFE Tap-2 Bias | | | |
| 235 | DQU5 DFE Tap-3 Bias | | | |
| 236 | DQU5 DFE Tap-4 Bias | | | |
| 237 | DQU5 IBCLK Sign | RFU | DQU5 DCA for IBCLK | |
| 238 | DQU5 $V_{REFDQ}$ Sign | DQU5 $V_{REFDQ}$ Offset | | |
| 239 | RFU | | | |
| 240 | RFU | | | |

| OP[3] | OP[2] | OP[1] | OP[0] |
|---|---|---|---|
| colspan=4 DQU2 DFE Tap-1 Bias ||||
| colspan=4 DQU2 DFE Tap-2 Bias ||||
| colspan=4 DQU2 DFE Tap-3 Bias ||||
| colspan=4 DQU2 DFE Tap-4 Bias ||||
| DQU2 CLK Sign | RFU | colspan=2 DQU2 DCA for QCLK ||
| DQU2 QBCLK Sign | RFU | colspan=2 DQU2 DCA for QBCLK ||
| colspan=4 RFU ||||
| colspan=4 DQU3 DFE for Gain Bias ||||
| colspan=4 DQU3 DFE Tap-1 Bias ||||
| colspan=4 DQU3 DFE Tap-2 Bias ||||
| colspan=4 DQU3 DFE Tap-3 Bias ||||
| colspan=4 DQU3 DFE Tap-4 Bias ||||
| DQU3 CLK Sign | RFU | colspan=2 DQU3 DCA for QCLK ||
| DQU3 QBCLK Sign | RFU | colspan=2 DQU3 DCA for QBCLK ||
| colspan=4 RFU ||||
| colspan=4 DQU4 DFE for Gain Bias ||||
| colspan=4 DQU4 DFE Tap-1 Bias ||||
| colspan=4 DQU4 DFE Tap-2 Bias ||||
| colspan=4 DQU4 DFE Tap-3 Bias ||||
| colspan=4 DQU4 DFE Tap-4 Bias ||||
| DQU4 CLK Sign | RFU | colspan=2 DQU4 DCA for QCLK ||
| DQU4 QBCLK Sign | RFU | colspan=2 DQU4 DCA for QBCLK ||
| colspan=4 RFU ||||
| colspan=4 DQU5 DFE for Gain Bias ||||
| colspan=4 DQU5 DFE Tap-1 Bias ||||
| colspan=4 DQU5 DFE Tap-2 Bias ||||
| colspan=4 DQU5 DFE Tap-3 Bias ||||
| colspan=4 DQU5 DFE Tap-4 Bias ||||
| DQU5 CLK Sign | RFU | colspan=2 DQU5 DCA for QCLK ||
| DQU5 QBCLK Sign | RFU | colspan=2 DQU5 DCA for QBCLK ||
| colspan=4 RFU ||||
| colspan=4 DQU6 DFE for Gain Bias ||||

*FIG. 4B*

ON-DIE LOGIC ANALYZER

PRIORITY INFORMATION

This application is a Continuation of U.S. application Ser. No. 17/067,288, filed Oct. 9, 2020, the contents of which are included herein by reference.

TECHNICAL FIELD

The present disclosure relates generally to memory devices, and more particularly, to apparatuses and methods related to an on-die logic analyzer.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

BRIEF DESCRIPTION OF THE DRAWINGS

FIG. 4A is a block diagram of a number of mode registers on a memory device with an on-die logic analyzer according to the present disclosure.

FIG. 4B is a block diagram of a number of mode registers on a memory device with an on-die logic analyzer according to the present disclosure.

DETAILED DESCRIPTION

Figure 1:
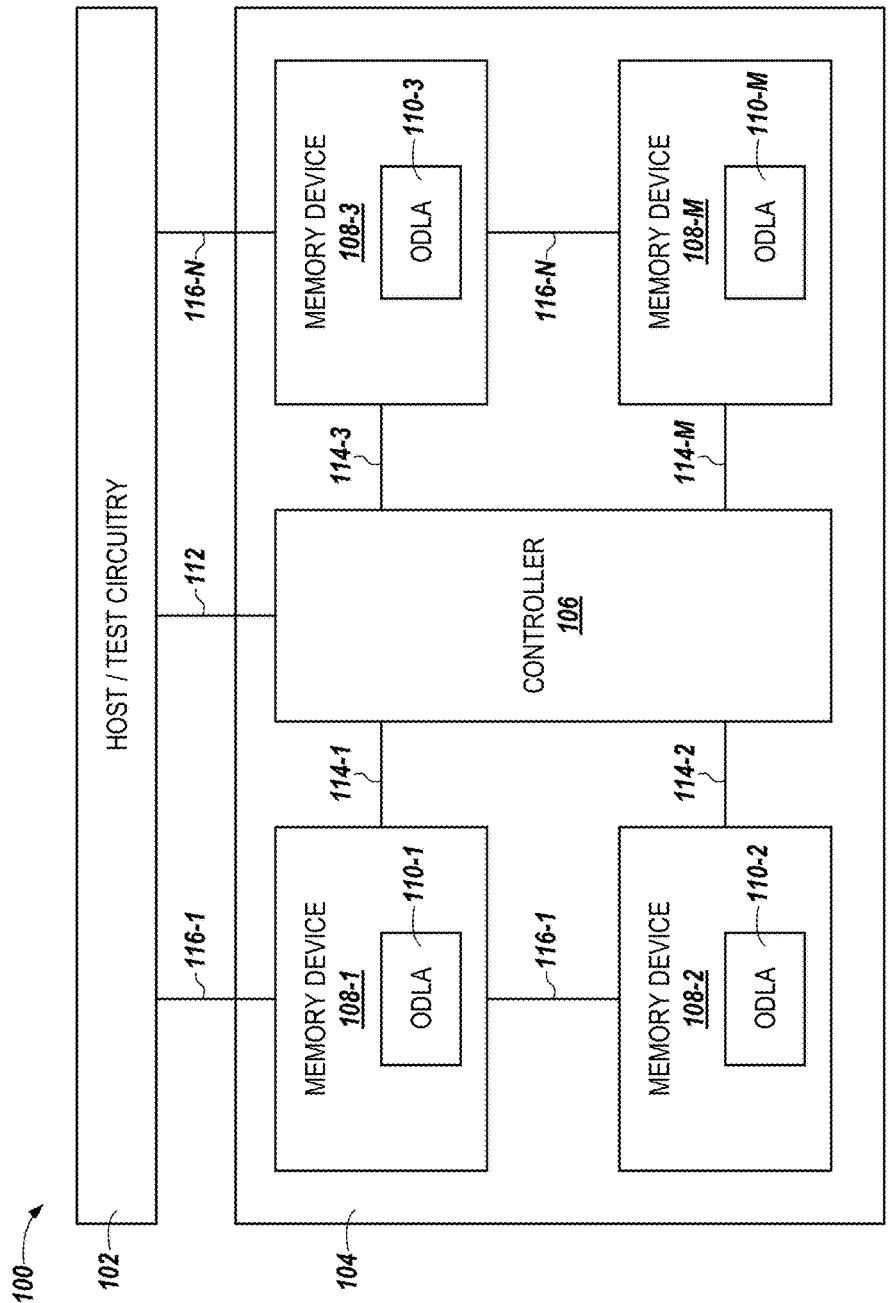
FIG. 1 is a block diagram of an apparatus in the form of a computing system including a memory system having memory devices with on-die logic analyzers according to the present disclosure.

The present disclosure includes apparatuses and methods related to an on-die logic analyzer (ODLA). Some memory systems may use inefficient command bus timings or improper command bus protocols from the memory controller to the memory array. If a command protocol is not followed properly, the memory system may generate errors or may not be able to operate at all. Verifying the command bus traffic is an important process in debugging a memory system. If timings between commands are not efficient, then the memory system may not be getting the full bandwidth available from the memory array.

Debugging the memory system is complicated by the fact that features such as decision feedback equalization (DFE) or continuous time linear equalization (CTLE) may not be measurable with equipment external to the memory die. DFE can reduce inter-symbol interference by using feedback from the memory bus receiver to provide better equalization, which can provide cleaner signaling to support higher transfer rates. CTLE is a linear filter applied at the receiver to attenuate low frequency signal components, amplify components around the Nyquist frequency, and filter off higher frequencies. Examples of equipment external to the memory die include mixed-signal oscilloscopes, external logic analyzers, and interposers. The external equipment can be used to check timings by seeing what settings have been programmed into a memory controller. Firmware code can be reviewed to check memory controller timings. However, this approach may not provide all of the relevant timings. Furthermore, the programming may not have been implemented properly and the actual timings being used may not be what the programmer thinks has been programmed.

The command signals going to the memory array can be broken out and measured with the external equipment. However, such external equipment for measuring signals associated with a memory die may not be able to measure the read capture window ("eye") at high speeds or with DFE or CTLE. Memory devices can include a reference signal to accompany data signals during a read operation. The reference signal ("strobe") can be used to track the output timing of the data signals read from the memory. The strobe may be generated during the read operation to enable a data latch (e.g., flip-flop) to properly latch the data read from the memory. The strobe can be analogized to a clock signal. When a strobe is received in phase with the data it is latching, the strobe may be centered in the middle of the eye of the data signal to help the latch accurately time the latch operation. The centering of the strobe may be accomplished with an adjustable delay circuit, such as a delay locked loop (DLL), which delays the strobe so that the latching edge of the strobe is received by the latch when the middle of the eye of the data signal is received by the latch.

Furthermore, breaking out the signals can cause additional undesirable issues because new elements are introduced to the circuit. Such new elements are not likely to have been considered in the design and simulation of the memory system, which means that they may affect the performance of the circuit. The eye at the receiver internal to the memory die may not match what is measured at the pin external to the memory die.

In order to address these and other issues associated with some previous approaches, at least one embodiment of the present disclosure make use of an ODLA on the memory device to reduce the time and resources that would otherwise be spent in validating or debugging memory system timings. Measuring in-system timing values can expose protocol violations or inefficiencies in the application of memory in a system. For example, refreshing memory too often will use excessive power and cause excessive heat generation. Inversely, not refreshing often enough risks data loss or poor data integrity. The ODLA is able to capture a memory controller's command sequence without introducing invasive components such as probes from a logic analyzer or oscilloscope. Customers of the memory vendor can also make use of the ODLA to validate their own command sequence or improve command-to-command timings. Thus, the time taken to debug the system can be reduced as the application of code in the memory controller would take the place of re-soldering system components, which also requires maintaining the signal integrity of the original, unperturbed transmission lines.

There are various memory applications for which the ODLA may be particularly useful. For example, in mobile and stacked memory applications it can be difficult or not feasible to isolate a single memory die in the stack due to the packaging. As another example, in emerging memory applications and new product architectures, the customer may be unaware of the technology behind the product, so an internal debug process may be easier.

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 210 may reference element "10" in FIG. 2, and a similar element may be referenced as 310 in FIG. 3. Analogous elements within a Figure may be referenced with a hyphen and extra numeral or letter. Such analogous elements may be generally referenced without the hyphen and extra numeral or letter. For example, elements 108-1, 108-2, 108-3, and 108-M in FIG. 1 may be collectively referenced as 108. As used herein, the designators "M" and "N", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of an apparatus in the form of a computing system 100 including a host 102 and a memory system 104 having memory devices 108-1, 108-2, 108-3, ..., 108-M with on-die logic analyzers 110-1, 110-2, 110-3, ..., 110-M according to the present disclosure. As used herein, a computing system 100, a host 102, a memory system 104, or a memory device 108, for example, might also be separately considered to be an "apparatus. In this example, the computing system 100 includes the host 102 coupled to the memory system 104 via an interface. The interface can pass control, address, data, and other signals between the memory system 104 and the host 102. The interface can include a command/address bus 112 and data buses 116-1, ..., 116-N. In some embodiments, the command/address bus 112 can be comprised of separate command and address buses. In some embodiments, the command/address bus 112 and the data buses 116 can be part of a common bus. The command/address bus 112 can pass signals from the host 102 to the controller 106 such as clock signals for timing, reset signals, chip selects, addresses for the memory devices 108, parity information, etc. The command/address bus 112 can be used by the controller 106 to send alert signals to the host 102. The command/address bus 112 can be operated according to a protocol. The interface can be a physical interface employing a suitable protocol. Such a protocol may be custom or proprietary, or the interface may employ a standardized protocol, such as Peripheral Component Interconnect Express (PCIe), Gen-Z interconnect, cache coherent interconnect for accelerators (CCIX), etc. In some embodiments, the controller 106 is a serial presence detect (SPD) hub or simply "hub," which may include a temperature sensor, clock functionality, isolation circuitry (e.g., an ability to isolate a bus on the module, such as a bus or buses 114) from other buses or from the host 102, such as via bus 112 or buses 116). In some cases, the controller 106 is a register clock driver (RCD), such as RCD employed on an RDIMM or LRDIMM.

The computing system 100 can be a personal laptop computer, a desktop computer, a digital camera, a mobile telephone, a memory card reader, or an Internet-of-Things (IoT) enabled device, among various other types of systems. For clarity, the computing system 100 has been simplified to focus on features with particular relevance to the present disclosure. The host 102 can include a number of processing resources (e.g., one or more processors, microprocessors, or some other type of controlling circuitry) capable of accessing the memory system 104. In some embodiments, the host 102 can comprise test circuitry suitable for testing the memory system 104 and/or the memory devices 108 prior to deployment of the memory system 104 (e.g., prior to sale, shipping, or use of the memory system 104). One of ordinary skill in the art will be familiar with test circuitry that can be used to test memory systems 104.

The memory system 104 can provide main memory for the computing system 100 or could be used as additional memory or storage throughout the computing system 100. By way of example, the memory system 104 can be a dual in-line memory module (DIMM) including memory devices 108 operated as double data rate (DDR) DRAM, such as DDR5, a graphics DDR DRAM, such as GDDR6, or another type of memory system. Embodiments are not limited to a particular type of memory system 104. Other examples of memory devices 108 include RAM, ROM, SDRAM, PCRAM, RRAM, flash memory, and three-dimensional cross-point, among others. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. The memory devices 108-1, 108-2 are coupled to the first data bus 116-1. The memory devices 108-3, 108-M are coupled to the second data bus 116-N. A data bus 116 can provide data for read/write operations between the host 102 and the memory system 104.

The memory system 104 can include a controller 106 coupled to the memory devices 108 via respective buses 114-1, 114-2, 114-3, 114-M. The buses 114 can be referred to as internal command/address buses 114 (e.g., internal to the memory system 104, as opposed to the command/address bus 112 between the host 102 and the memory system 104). The controller 106 can be implemented as hardware, firmware, and/or software. For example, the controller 106 can be an application specific integrated circuit (ASIC) coupled to a printed circuit board including a physical interface. The controller 106 can thereby relay command and/or address signals from the command/address bus 112 from the host 102 to the memory devices 108. In some embodiments, the controller 106 may perform command and/or address translation of the command and/or address signals from the host 102 before relaying the same to the memory devices 108. The controller 106 may operate the command/address buses 114 with a same or different protocol than that with which the command/address bus 112 is operated between the host 102 and the memory system 104. The controller 106 can use the buses 114 to send command and/or address signals, clock signals, select signals, and other related signals to the memory devices 108. The memory devices 108 can use the buses 114 to send error signals, reset signals, and other related signals to the controller 106. The controller 106 thus provides access to the memory devices 108 for the host 102. Examples of the commands for the memory devices 108 include read, write, and erase commands for data on the memory devices 108, among other commands. The memory system 104 can include separate integrated circuits, or both the controller 106 and the memory devices 108 can be on the same integrated circuit.

The memory devices 108 are each illustrated as including an ODLA 110. The "die" in on-die logic analyzer refers to the memory device 108 on which the ODLA 110 is located. Each memory device 108 can be a separate memory die, which may also be referred to as a chip. The ODLA 110 can use a clock signal from the command/address bus 114 to measure the timing between various commands received from the command/address bus 114 in order to troubleshoot the memory system 104. The ODLA 110 is described in more detail with respect to FIG. 3.

Figure 2:
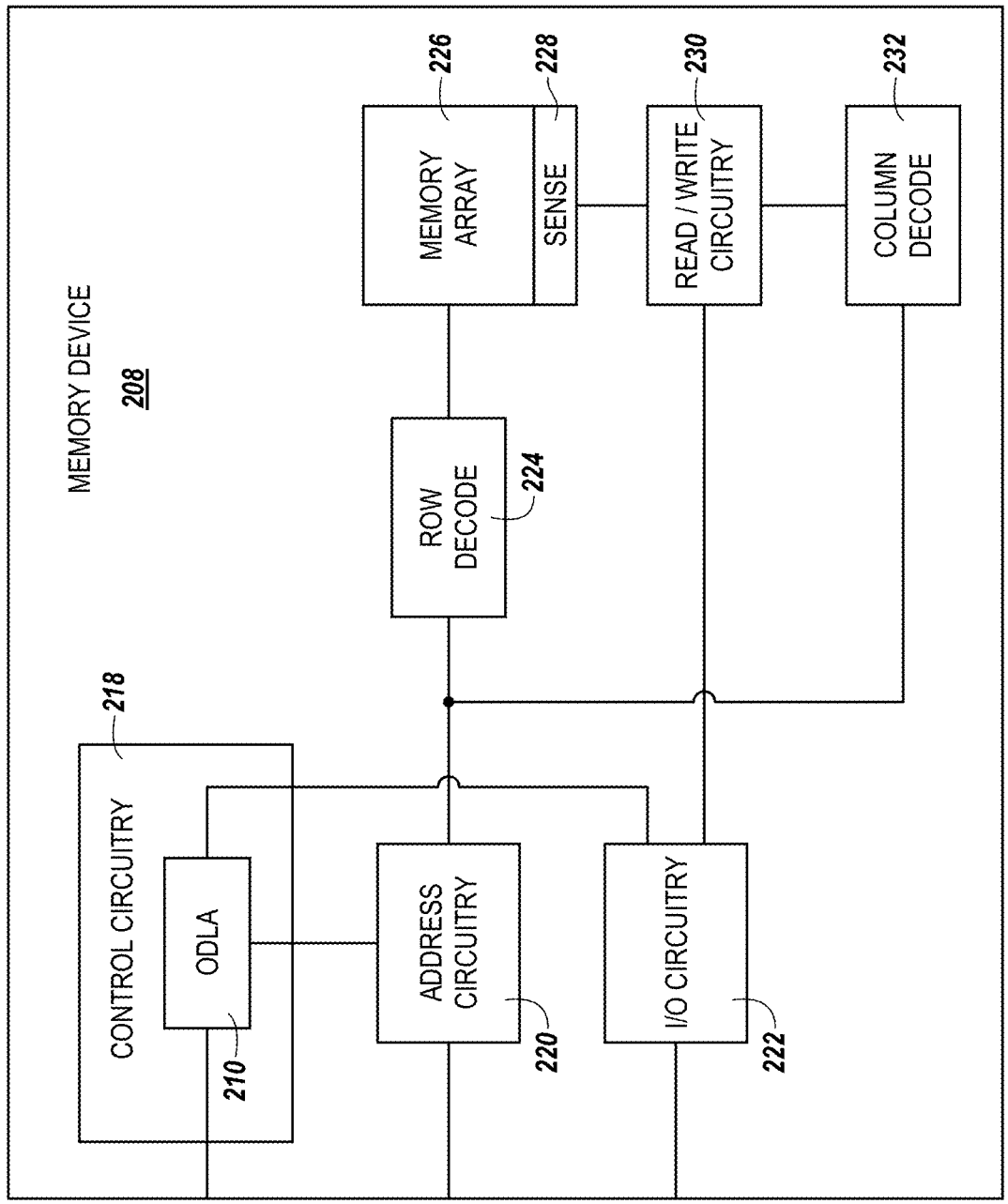
FIG. 2 is a block diagram of an apparatus in the form of a memory device with an on-die logic analyzer according to the present disclosure.

FIG. 2 is a block diagram of an apparatus in the form of a memory device 208 with an on-die logic analyzer 210 according to the present disclosure. The memory device 208 is analogous to any of the memory devices 108 illustrated in FIG. 1. The control circuitry 218 decodes signals provided by the controller (not specifically illustrated). The signals can be commands provided by the controller that may have originated with a host and/or test circuitry (not specifically illustrated). These signals can include chip enable signals, write enable signals, and address latch signals, among others, that are used to control operations performed on the memory array 226. Such operations can include data read operations, data write operations, data erase operations, data move operations, etc. In various embodiments, the control circuitry 218 is responsible for executing instructions from the controller. The control circuitry 218 can comprise a state machine, a sequencer, and/or some other type of control circuitry, which may be implemented in the form of hardware, firmware, or software, or any combination of the three.

According to at least one embodiment of the present disclosure, the control circuitry 218 also includes an ODLA 210. As illustrated, the ODLA 210 can be coupled to the interface that the control circuitry 218 uses to communicate off the memory device 208. For example, the interface can be coupled to a memory controller. The representation of the connection between the ODLA 210 and the interface does not mean that the ODLA 210 uses the entirety of the interface bandwidth and communication for the control circuitry 218. Rather, it means that the ODLA 210 shares the interface with the control circuitry 218. Commands that flow through the control circuitry 218 (e.g., from a controller) can also flow through the ODLA 210. The ODLA 210 can also be coupled to the I/O circuitry 222 for communication with a host and/or test circuitry. The ODLA 210 is described in more detail with respect to FIG. 3.

Data can be provided to and/or from the memory array 226 via data lines coupling the memory array 226 to the I/O circuitry 222 via read/write circuitry 230. The I/O circuitry 222 can be used for bi-directional data communication with the host and/or test circuitry over an interface. The read/write circuitry 230 is used to write data to the memory array 226 or read data from the memory array 226. As an example, the read/write circuitry 230 can comprise various drivers, latch circuitry, etc. In some embodiments, the data path can bypass the controller (e.g., the controller 106 illustrated in FIG. 1).

The memory device 208 includes address circuitry 220 to latch address signals provided over an interface. Address signals are received and decoded by a row decoder 224 and a column decoder 232 to access the memory array 226. Data can be read from memory array 226 by sensing voltage and/or current changes on the sense lines using sensing circuitry 228. The sensing circuitry 228 can be coupled to the memory array 226. Each memory array 226 and corresponding sensing circuitry 228 can constitute a bank of the memory device 208. The sensing circuitry 228 can comprise, for example, sense amplifiers that can read and latch a page (e.g., row) of data from the memory array 226.

The memory array 226 can comprise memory cells arranged in rows coupled by access lines (which may be referred to herein as word lines or select lines) and columns coupled by sense lines (which may be referred to herein as digit lines or data lines). Although the memory array 226 is shown as a single memory array, the memory array 226 can represent a plurality of memory array arraigned in banks of the memory device 208. The memory array 226 can include a number of memory cells, such as volatile memory cells (e.g., DRAM memory cells, among other types of volatile memory cells) and/or non-volatile memory cells (e.g., RRAM memory cells, among other types of non-volatile memory cells).

Figure 3:
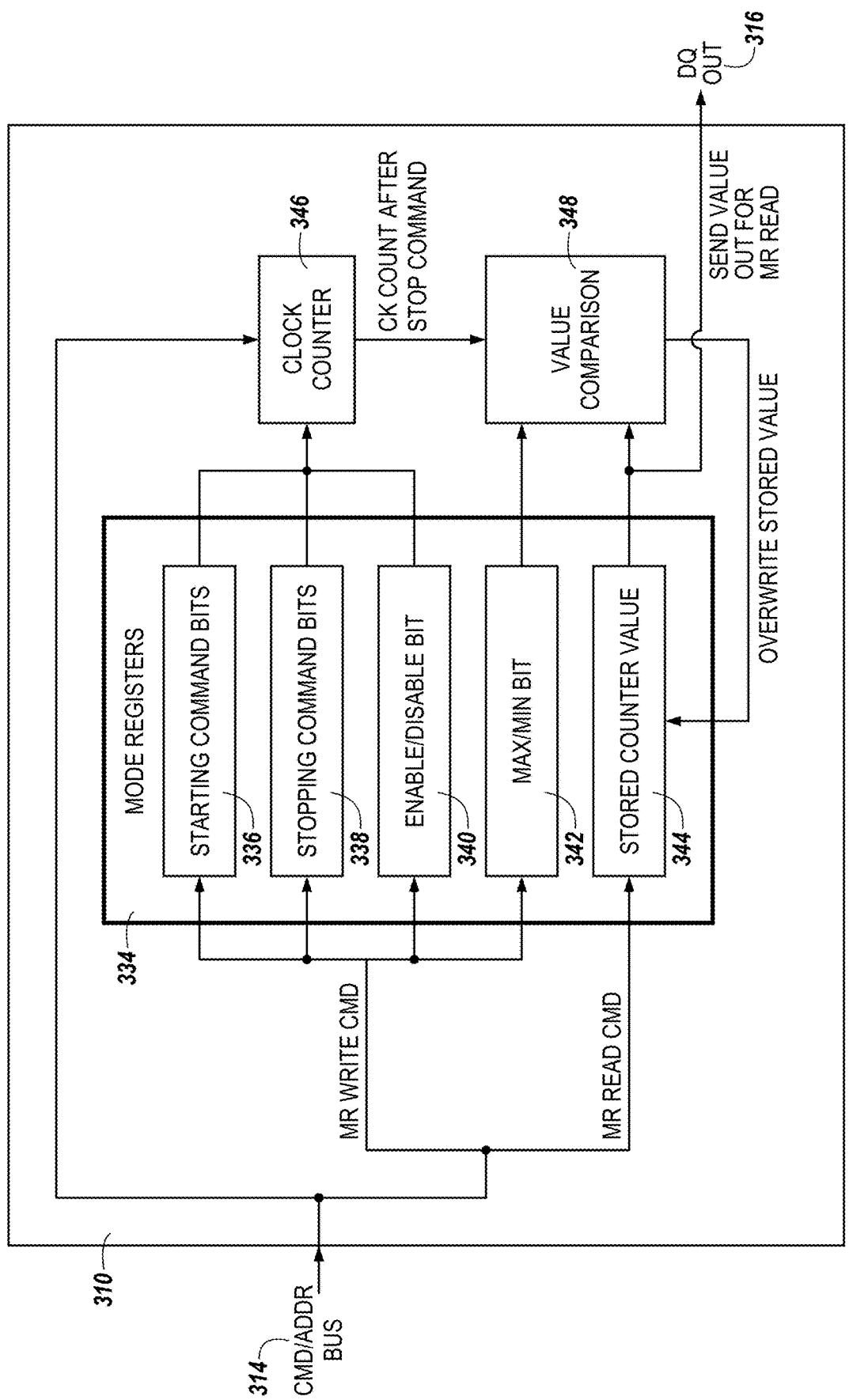
FIG. 3 is a block diagram of an on-die logic analyzer according to the present disclosure.

FIG. 3 is a block diagram of an on-die logic analyzer 310 according to the present disclosure. The ODLA 310 can be integrated with the control circuitry of a memory device as illustrated in FIG. 2. The ODLA 310 can be coupled to the command/address bus ("Cmd/Addr Bus") 314 and the data bus ("DQ Out") 316 The command/address bus 314 can be coupled to a controller (e.g., the controller 106 illustrated in FIG. 1) while the data bus 316 can be coupled to a host and/or test circuitry (e.g., the host and/or test circuitry 102 illustrated in FIG. 1). In some embodiments, the data bus 316 can be coupled to the host and/or test circuitry via I/O circuitry (e.g., the I/O circuitry 222 illustrated in FIG. 2).

The ODLA 310 can include a counter (e.g., a clock counter) 346 configured to count clock cycles. The ODLA can receive a clock signal from the command/address bus 314 or a separate clock bus (not specifically illustrated). Because the clock cycles can change while the ODLA is counting, some embodiments of the present disclosure include measures to scale the count to the (changed) clock cycles. For example, a raw array timer oscillator can be used in conjunction with the counter 346 to scale the count correctly with the clock cycles. As another example, an internal column-to-column delay setting can be used to scale the counter with the clock cycles. A column-to-column delay is normally used when switching between different bank groups in memory, which uses a delay of a particular quantity of clock cycles, depending on the speed of the memory and the change in bank groups. Such scaling can be beneficial, for example, where the counter is counting a rising edge of a clock signal, and therefore would not be inherently aware of the frequency of the clock signal, or changes thereto. Although not specifically illustrated, at least one embodiment of the present disclosure does not include a counter 346 for the ODLA and instead relies on an output pulse on an output pin that reflects timing and mimics that of a logic analyzer.

The ODLA 310 can include a number of mode registers 334 and/or an on-die storage array (not specifically illustrated). For example, a mode register 336 can store starting command bits, a mode register 338 can store stopping command bits, a mode register 340 can store an enable/disable bit, a mode register 342 can store a max/min bit, and a mode register 344 can store a counter value. Embodiments are not limited to the ODLA 310 including any particular quantity of registers. The ODLA can include more or fewer registers than those illustrated in FIG. 3.

A mode register command received via the command/address bus 314 can write to a first mode register 336 to define a start command, receipt of which causes the ODLA 310 to start counting clock cycles (e.g., with the counter 346). The start command can be defined as any command receivable by the control circuitry as the OLDA 310 can be used to troubleshoot different commands and command sequences. A mode register command can write to a second mode register 338 to define a stop command, receipt of which causes the ODLA 310 to stop counting clock cycles. Receipt of the stop command can also cause counter 346 to be reset. Like the start command, the stop command can be defined as any command receivable by the control circuitry. The mode register commands can be sent by a host and/or test circuitry via a controller to the ODLA 310 associated with the control circuitry.

A mode register command can write to a third mode register 340 to enable or disable the ODLA 310. When disabled, the ODLA 310 is essentially in a power-save mode because the counter 346 is not operating, even if a defined start command is received. However, when enabled, receipt of a defined start command can cause the counter 346 to start counting clock cycles until a defined stop command is received or until the ODLA 310 is disabled, for example, by a disable bit being written to the third mode register 340. In some embodiments, rather than using the enable/disable mode register 340, the ODLA 310 is configured to be "always on" or is configured to enter a test mode, activating the ODLA, in response to being connected to a host comprising testing circuitry.

A mode register command can write to a fourth mode register 342 to define whether the ODLA 310 stores a minimum count or a maximum count for successive instances of the defined start command and the defined stop command. In the following example, the defined start command is "WRITE Bank 3" and the defined stop command is "READ Bank 3". The ODLA 310 will start counting clock cycles upon receipt of a "WRITE Bank 3" command and stop counting clock cycles upon receipt of a "READ Bank 3" command. The quantity of clock cycles between these commands can be referred to as a write-to-read delay (tWTR). One of ordinary skill in the art will appreciate that the time between different commands can be measured to track different delays and memory timing parameters that are helpful in assessing the performance of memory. When a max bit is set, the ODLA 310 will store the value of the counter if it is greater than a previously stored value or if no value was previously stored. When a min bit is set, the ODLA 310 will store the value of the counter if it is less than a previously stored value or if no value was previously stored. The ODLA 310 is thus configured to store a maximum count or a minimum count depending on the value stored in the fourth mode register 342. The ODLA 310 is configured to write the maximum or minimum count to a fifth mode register 344 to store the maximum or minimum count depending on the value stored in the fourth mode register 342. The ODLA 310 can include a comparator 348 to compare the minimum count or the maximum count stored in the fifth mode register 344 with the current count in order to determine whether to save the current count (if it is greater than the stored maximum count or less than the stored minimum count depending on the value stored in the fourth mode register 342).

After the defined stop command has been received, the counter 346 can be reset and the OLDA 310 can wait for the defined start command to be received again. When the defined start command is received again, the counter 346 can start counting clock cycles until the defined stop command is received again. The, ODLA 310 can use the comparator 348 to compare the value of the counter 346 against the value stored in the fifth mode register 344 and determine whether or not the new count should be stored based on the value of the fourth mode register 342. This process can repeat until the ODLA 310 is disabled by a disable bit being written to the third mode register 340 or until different start command and stop command are defined by being written to the first mode register 336 and the second mode register 338 respectively.

Although not specifically illustrated, the ODLA 310 can include a sixth mode register. The ODLA 310 can be configured to write to the sixth mode register to store a value indicating a quantity of times that the stopped count exceeded a previously stored count. Each time that the stopped count exceeds a previously stored count, the OLDA 310 can increment the value stored in the sixth mode register by one in order to keep track of the quantity of times that a maximum or minimum count is exceeded for a particular pair of commands. Such information may be useful in troubleshooting command timing issues by indicating how often maximum or minimum timings are exceeded for a particular pair of commands.

The ODLA 310 can include an output to the data bus 316 to allow information about command timings to be read out from the ODLA 310. Such information can include the maximum or minimum count stored in the fifth register 344 and/or a quantity of times that the maximum or minimum count has occurred. The host and/or test circuitry can send a command to the ODLA 310 to cause the ODLA 310 to output the maximum or minimum count stored in the fifth register 344 and/or the value stored in the sixth register to the data bus 316. For example, such a command can be a mode register read command for the pertinent mode register. A value of zero read from the pertinent mode register would indicate that the defined start and stop commands have not been received since the ODLA 310 was enabled.

Although not specifically illustrated, some embodiments can include more than one counter 346 and additional registers 334 in order to provide the ODLA 310 with the ability to simultaneously track timings for different command pairs. For example, the ODLA 310 can be configured with multiple stored counter value registers 344 in order to save the max/min timings for different command pairs without having to erase or overwrite a previously stored count for a different command pair. In some embodiments, the ODLA 310 can include a small memory configured to store a look-up table, which would take the place of the stored counter value register(s) 344 and/or the mode register(s) that stores a value indicating the quantity of times that a corresponding stored counter value register(s) 344 has been updated. Such embodiments can reduce a dependence, for example, on the availability of mode registers that are reserved for use, as described below with respect to FIGS. 4A-4B. If a testing sequence runs a large set of commands, using multiple counters and a table can parallelize monitoring and reduce test time and/or the overall debug time of the testing sequence. Many different timings can be monitored at once during the testing sequence to verify that timing expectations match what is actually being received on the memory. Such embodiments can also be useful for efficient debugging of code, where the root cause of a timing failure can be isolated with the performance of a relatively large testing sequence without having to do manual debugging.

In some embodiments, the testing functionality of the ODLA 310 can be used by customers after deployment of the memory device. As such, the ODLA 310 can be used to help debug timing issues when the memory device is being used for live applications, as opposed to when the memory device is being tested.

In some embodiments, the testing functionality of the ODLA 310 can be hidden from customers and only available to the memory manufacturer (e.g., via remote monitoring). As another example, internal timings can be monitored throughout usage of the memory device and saved for analysis by the manufacturer in the event of a failure of the memory device. A fuse blow sequence can be triggered after an event to cause the ODLA 310 to store the recorded timing values in a manner that can be reviewed when the memory device is returned to the manufacturer (e.g., via RMA). Examples of such events include an ECC failure, an unexpected power-down, etc. Such embodiments can be beneficial to evaluate typical customer usage and/or to help determine whether a customer violated the datasheet specs for the memory device. Customers may be reluctant to share their initial test code, but the ODLA 310 can allow the manufacturer to have insight into what is being run in order to help debug failures, particularly during the early customer sample phase.

FIGS. 4A-4B illustrate a block diagram of a number of mode registers 434 on a memory device with an on-die logic analyzer according to the present disclosure. The figure is split onto two sheets due to spacing constraints. The mode registers 434 illustrated in FIGS. 4A-4B are for a DDR5 DRAM memory. The mode registers 434 can be read and/or written to based on commands from a host, test circuitry, a controller, and/or control circuitry (e.g., host/test circuitry 102, controller 106, control circuitry 218 in FIGS. 1-2). The mode registers 450 labeled "RFU" indicate that they are reserved for future use. Such mode registers 450 can be used to fill the role of the mode registers described above in connection with FIG. 3 (e.g., first mode register 336, second mode register 338, third mode register 340, fourth mode register 342, fifth mode register 344, etc.).

Figure 5:
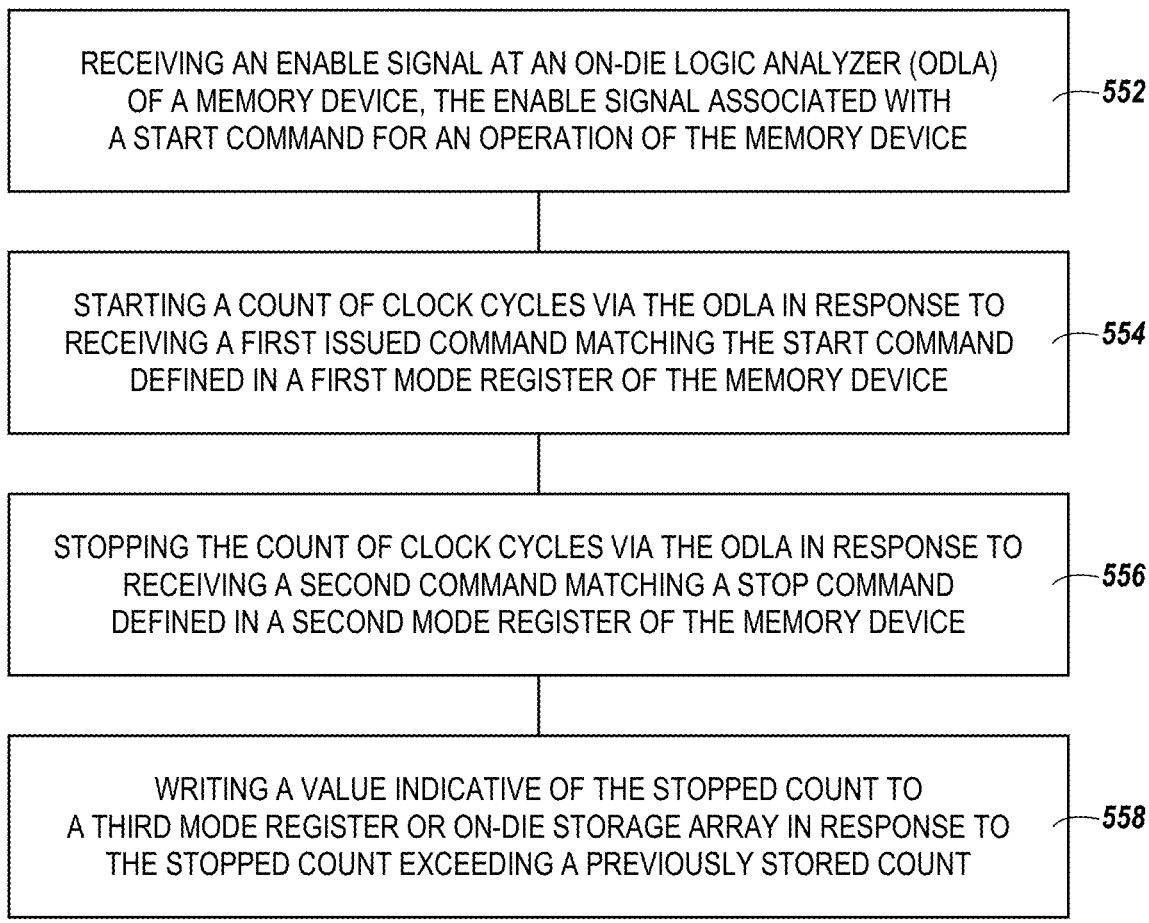
FIG. 5 is a flow diagram illustrating a method for on-die logic analysis according to the present disclosure.

FIG. 5 is a flow diagram illustrating a method for on-die logic analysis according to the present disclosure. The method described in FIG. 5 can be performed by, for example, an ODLA, such as the ODLA 310 illustrated in FIG. 3. At block 552, the method can include receiving an enable signal at an ODLA of a memory device, the enable signal associated with a start command for an operation of the memory device. At block 554, the method can include starting a count of clock cycles via the ODLA in response to receiving a first command matching the start command defined in a first mode register of the memory device. Although not specifically illustrated, the method can include receiving a disable signal at the ODLA with respect to the start command and not starting the count of clock cycles in response to a subsequently issued command matching the start command.

At block 556, the method can include stopping the count of clock cycles via the ODLA in response to receiving a second command matching a stop command defined in a second mode register of the memory device. At block 558, the method can include writing a value indicative of the stopped count to a third mode register or an on-die storage array in response to the stopped count exceeding a previously stored count. The ODLA can also write, to a fourth mode register, a value indicating a quantity of times that the stopped count exceeded a previously stored count.

The method can include the ODLA comparing the stopped count to a previously stored count to determine whether the stopped count exceeds the previously stored count. Comparing the stopped count to the previously stored count can include determining whether the sopped count is greater than the previously stored count in response to a max bit being stored in a fourth mode register. Comparing the stopped count to the previously stored count can include determining whether the sopped count is less than the previously stored count in response to a min bit being stored in a fourth mode register.

Receiving the enable signal, starting the count, stopping the count, and writing the value indicative of the stopped count can collectively comprise performing a test operation prior to deployment of a memory device with which the ODLA is integrated. For example, the test operation can be a quality control test performed to determine whether the memory device is suitable for use by a customer.

Although not specifically illustrated, the ODLA can be configured to track different counts for different pairs of commands and write values indicative of maximum or minimum counts for the different pairs of commands. Such embodiments can be useful for easily tracking different memory timings without redefining the start and stop commands. The circuitry necessary to implement the ODLA can have a minimal impact to die size and can be scaled based on a desired implementation and die size restrictions. For example, if more die size is available, the ODLA can be configured to store a greater quantity of timing parameters for different pairs of commands.

Accordingly, in some embodiments, the method can include receiving an enable signal at the ODLA with respect to a different start command and starting a different count of clock cycles at the ODLA in response to a third issued command matching the different start command defined in a third mode register. The method can include stopping the different count of clock cycles at the ODLA in response to a fourth issued command matching a different stop command defined in a fourth mode register. The method can include writing a value indicative of the stopped different count in response to the different stopped count exceeding the previously stored count. The different count can exceed the previously stored count either positively or negatively. A value indicative of the different stopped count can be written in place of the previously stored count based on the value of a corresponding max/min bit stored in a mode register.

Figure 6:
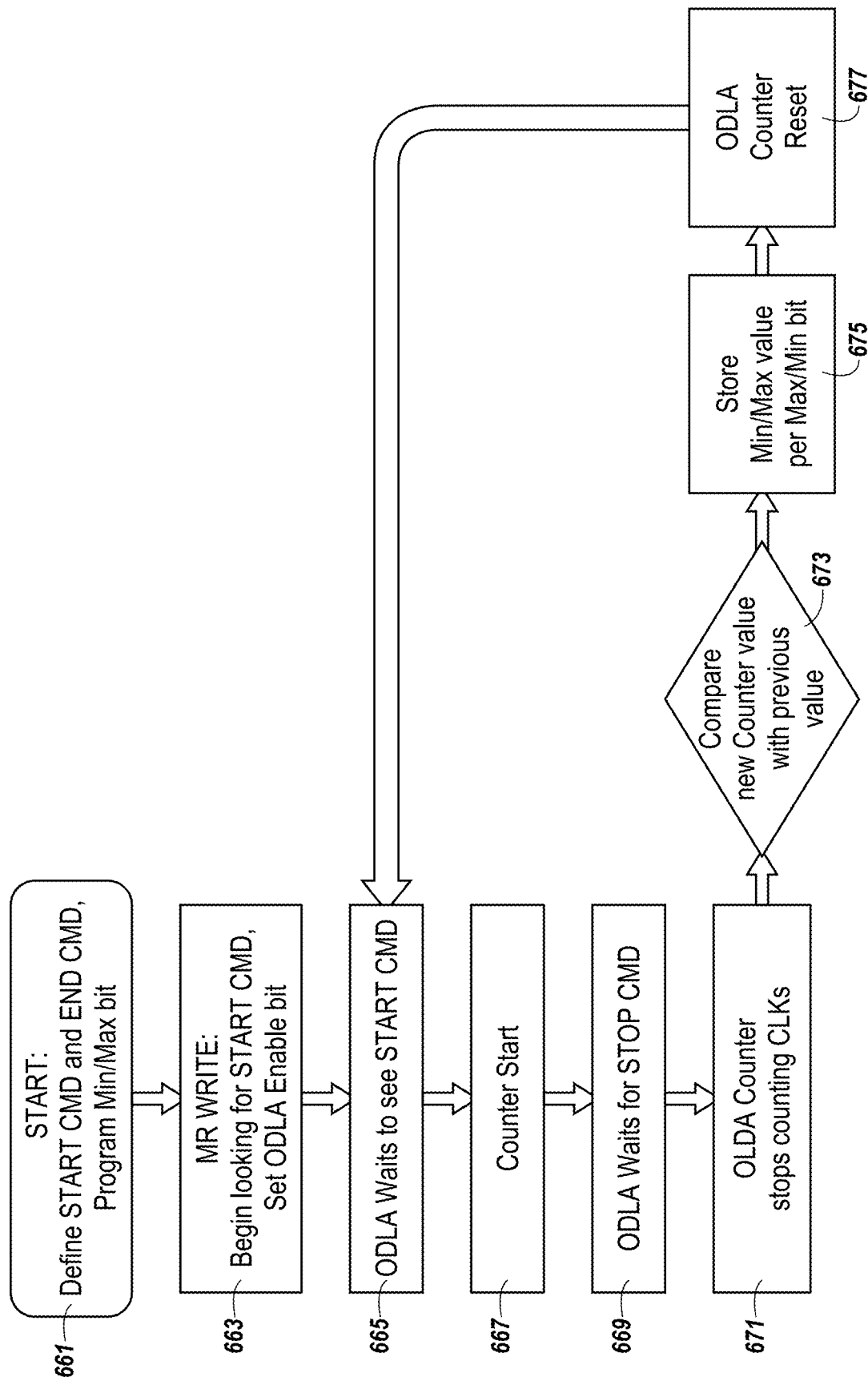
FIG. 6 is a flow diagram illustrating an on-die logic analysis process according to present disclosure.

FIG. 6 is a flow diagram illustrating an on-die logic analysis process according to present disclosure. At 661, the process starts with the definition of a start command, an end command, and a max/min bit. As described herein, the start command, end command, and max/min bit can be written to mode registers of an ODLA. After the mode registers have been programmed accordingly, the ODLA can be enabled with an enable bit being written to an appropriate mode register and the ODLA can begin looking for the defined start command as indicated at 663.

At 665, the ODLA can wait to receive the defined start command. At 667, after the defined start command is received, the ODLA can start a counter, which increments for every clock cycle. At 669, the ODLA can wait for reception of the defined stop command. After the defined stop command is received, the ODLA can stop the counter as indicated at 671. The ODLA can then compare the stopped count with a previously stored count, if one exists, as indicated at 673.

The ODLA will write a value indicative of the stopped count if it exceeds the stored count based on the value of the max/min bit as indicated at 675. If the max bit is set, then the ODLA will write a value indicative of the stopped count if it is greater than the previously stored count or if no previously stored count exists. If the min bit is set, then the ODLA will write a value indicative of the stopped count if it is less than the previously stored count or if no previously stored count exists. At 677, the ODLA resets the counter and waits until another command matching the defined start command is received as indicated by the arrow from 677 to 665. This loop can be exited by the ODLA receiving a disable command. A mode register read command can be used to cause the ODLA to output the stored count to the data bus.

Embodiments can include a tangible machine-readable storage medium (also known as a computer-readable medium) on which is stored one or more sets of instructions or software embodying any one or more of the methodologies or functions described herein. In some embodiments, a memory device or a processing device constitutes a machine-readable medium. The term "machine-readable storage medium" includes a single medium or multiple media that store the one or more sets of instructions. The term "machine-readable storage medium" includes any medium that is capable of storing or encoding a set of instructions for execution by the machine and that cause the machine to perform any one or more of the methodologies of the present disclosure. The term "machine-readable storage medium" includes, but is not limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory array;
   an on-die logic analyzer (ODLA) coupled to the memory array, wherein the ODLA includes an on-die storage array; and
   control circuitry coupled to the memory array and to the ODLA, wherein the control circuitry is configured to:
   write to the on-die storage array to define a start command, receipt of which causes the ODLA to start counting clock cycles;
   write to the on-die storage array to define a stop command, receipt of which causes the ODLA to stop counting clock cycles;
   write to the on-die storage array to enable the ODLA; and
   write to the on-die storage array to define whether the ODLA stores a maximum count or a minimum count for successive instances of the start command and the stop command.

2. The apparatus of claim 1, wherein the control circuitry is further configured to write to the on-die storage array to disable the ODLA.

3. The apparatus of claim 1, wherein the ODLA is configured to write to the on-die storage array to store the maximum count or the minimum count.

4. The apparatus of claim 3, wherein the ODLA includes an output to a data bus; and
   wherein the control circuitry is configured to output the maximum or the minimum count from the on-die storage array via the data bus in response to a request for the count.

5. The apparatus of claim 4, wherein the ODLA is configured to write to the on-die storage array to store a value indicating a quantity of times that a maximum count or a minimum count has occurred.

6. The apparatus of claim 5, wherein the control circuitry is configured to output the value from the on-die storage array via the data bus in response to a request for the value.

7. The apparatus of claim 3, wherein the ODLA includes a comparator to compare the minimum count or the maximum count stored in the on-die storage array with a current count.

8. The apparatus of claim 1, wherein the ODLA includes a counter to count clock cycles.

9. A method, comprising:
   counting, via an on-die logic analyzer (ODLA) of a memory device, respective clock cycles between each of a plurality of pairs of commands issued to the memory device;
   writing, via the ODLA, a value indicative of a respective minimum or maximum quantity of clock cycles for each of the plurality of pairs of commands; and
   outputting, via the ODLA, the respective minimum or maximum quantity of clock cycles for a particular pair of commands of the plurality of pairs of commands in response to a request.

10. The method of claim 9, further comprising writing the value indicative of the respective minimum or maximum quantity of clock cycles for each of the plurality of pairs of commands in a respective one of a plurality of registers of the ODLA.

11. The method of claim 9, further comprising writing the value indicative of the respective minimum or maximum quantity of clock cycles for each of the plurality of pairs of commands in internal memory of the ODLA as a look-up table.

12. The method of claim 9, further comprising scaling the count in response to a frequency of the clock cycles changing.

13. An apparatus, comprising:
a memory array;
an on-die logic analyzer (ODLA) coupled to the memory array; and
control circuitry coupled to the memory array and to the ODLA, wherein the control circuitry is configured to:
start a count of clock cycles in response to receiving a first command matching a start command defined in the ODLA;
stop the count of clock cycles in response to receiving a second command matching a stop command defined in the ODLA; and
write a value indicative of the stopped count in response to the stopped count exceeding a previously stored count.

14. The apparatus of claim 13, wherein the control circuitry is configured to compare the stopped count to the previously stored count to determine whether the stopped count is greater than the previously stored count in response to a max bit being stored in the ODLA.

15. The apparatus of claim 13, wherein the control circuitry is configured to compare the stopped count to the previously stored count to determine whether the stopped count is less than the previously stored count in response to a min bit being stored in the ODLA.

16. The apparatus of claim 13, wherein the control circuitry being configured to start the count, stop the count, and write the value indicative of the stopped count collectively comprise the control circuitry being configured to perform a test operation prior to deployment of the apparatus.

17. The apparatus of claim 13, wherein the control circuitry is configured to write a value indicating a quantity of times that the stopped count exceeded a previously stored count.

18. The apparatus of claim 13, wherein the control circuitry is configured to start the count, stop the count, and write the value in response to receiving an enable signal associated with the start command.

19. The apparatus of claim 18, wherein the control circuitry is configured not to start the count, not to stop the count, and not to write the value in response to receiving a disable signal associated with the start command.

20. The apparatus of claim 18, wherein the control circuitry is configured to:
store an enable bit in response to receiving the enable signal;
start the count, stop the count, and write the value for any subsequently received start command while the enable bit is stored; and
store a disable bit in response to receiving a disable signal.

* * * * *